(12) United States Patent
Singh

(10) Patent No.: US 9,960,248 B2
(45) Date of Patent: May 1, 2018

(54) FIN-BASED RF DIODES

(71) Applicant: GLOBALFOUNDRIES Inc., Grand Cayman (KY)

(72) Inventor: Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/616,653

(22) Filed: Jun. 7, 2017

(65) Prior Publication Data

US 2018/0026113 A1 Jan. 25, 2018

Related U.S. Application Data

(62) Division of application No. 15/218,318, filed on Jul. 25, 2016, now Pat. No. 9,704,966.

(51) Int. Cl.
| | |
|---|---|
| *H01L 21/70* | (2006.01) |
| *H01L 29/66* | (2006.01) |
| *H01L 29/861* | (2006.01) |
| *H01L 21/265* | (2006.01) |
| *H01L 29/06* | (2006.01) |
| *H01L 21/762* | (2006.01) |
| *H01L 27/08* | (2006.01) |

(52) U.S. Cl.
CPC .... *H01L 29/6609* (2013.01); *H01L 21/26513* (2013.01); *H01L 21/76224* (2013.01); *H01L 27/0814* (2013.01); *H01L 29/0649* (2013.01); *H01L 29/861* (2013.01)

(58) Field of Classification Search
CPC ........... H01L 29/6609; H01L 29/66136; H01L 29/66143; H01L 27/0814; H01L 29/861
See application file for complete search history.

(56) References Cited

U.S. PATENT DOCUMENTS

| | | | |
|---|---|---|---|
| 9,472,620 B1 * | 10/2016 | Wang | ................... H01L 29/1054 |
| 2008/0185691 A1 * | 8/2008 | Cheng | ................. H01L 29/0649 |
| | | | 257/656 |
| 2010/0202186 A1 | 8/2010 | Sato et al. | |
| 2011/0001169 A1 | 1/2011 | Ozcan et al. | |

(Continued)

OTHER PUBLICATIONS

Bremner, "ELEG620: Solar Electric Systems", ECE Spring 2009, Retrieved on Jul. 14, 2016 from http://www.solar.udel.edu/ELEG620/Introduction09.pdf, 32 Pages.

(Continued)

*Primary Examiner* — Khiem D Nguyen
(74) *Attorney, Agent, or Firm* — Ditthavong & Steiner, P.C.

(57) ABSTRACT

Methods for forming a fin-based RF diode with improved performance characteristics and the resulting devices are disclosed. Embodiments include forming fins over a substrate, separated from each other, each fin having a lower portion and an upper portion; forming STI regions over the substrate, between the lower portions of adjacent fins; implanting the lower portion of each fin with a first-type dopant; implanting the upper portion of each fin, above the STI region, with the first-type dopant; forming a junction region around a depletion region and along exposed sidewalls and a top surface of the upper portion of each fin; and forming a contact on exposed sidewalls and a top surface of each junction region.

18 Claims, 7 Drawing Sheets

(56) References Cited

U.S. PATENT DOCUMENTS

2015/0014809 A1* 1/2015 Wang .................... H01L 29/861
                                                    257/506
2015/0194419 A1* 7/2015 Singh ................ H01L 29/41708
                                                    257/173

OTHER PUBLICATIONS

Fischetti, "ECE344 Semiconductor Devices and Materials (Fall 2009)", ECE344 Fall 2009, Retrieved on Jul. 14, 2016 from http://www.ecs.umass.edu/ece/ece344/ECE344_2.pdf, pp. 95-149.
Singh et al. "Analog, RF, and ESD Device Challenges and Solutions for 14nm FinFET Technology and Beyond", 2014 Symposium on VLSI Technology: Digest of Technical Papers, IEEE, Jun. 9-12, 2014, 2 Pages.

* cited by examiner

FIN-BASED RF DIODES

RELATED APPLICATION

This application is a divisional of U.S. patent application Ser. No. 15/218,318, filed Jul. 25, 2016, issued as U.S. Pat. No. 9,704,966, entitled "FIN-BASED RF DIODES", which is incorporated herein by reference in its entirety.

TECHNICAL FIELD

The present disclosure relates generally to designing and fabricating integrated circuit (IC) devices. The present disclosure is particularly applicable to radio frequency (RF) diodes in fin-type devices, particularly for the 14 nanometer (nm) technology node and beyond.

BACKGROUND

A diode may be switched from a conducting state (forward-bias) to a non-conducting (reverse-bias) state. The speed at which the switching can occur may be limited by the time it takes to remove or add electrical charge to/from the depletion region of the diode. The time may be based on two parameters: the lifetime of the carriers, $\tau n$ and $\tau p$, and the capacitance of the junction area. In the switching process, excess minority carriers (holes in the n region and electrons in the p region) which exist under forward-bias have to "recombine away" through the depletion region. Moreover, a larger junction area allows for a larger current to flow, and the series resistance drops. Conventional fin-based diodes, formed by growing embedded silicon germanium (eSiGe) at the top of p+ fins, with the p+/n-well junction at the interface between the fin and the eSiGe, suffer from non-ideality and leakage, among other things. The junction can be optimized by making the entire fin of grown eSiGe. The optimized diode has low leakage current and an excellent ideality range, even at increased temperatures.

RF diodes have characteristics that make them particularly attractive in IC devices. For example, an RF diode has an increased depletion region width over a conventional diode, which leads to lowering of capacitance. In addition, for small signals at high frequencies the stored carriers within the intrinsic layer are not completely swept by the RF signal or recombined (due to a large Fin height region). At such frequencies there is no rectification or distortion, and the RF diode characteristic is that of a linear resistor, which introduces no distortion or rectification. The RF diode resistance is governed by the DC bias applied. In this way it is possible to use the device as an effective RF switch or variable resistor for an attenuator producing far less distortion than ordinary PN junction diodes. However, RF diodes implemented in fin-type devices not only need to meet performance characteristics such as leakage current, ideality, and breakdown voltage, but also need to prevent increases in parasitic resistance or capacitance. With scaling down of IC devices, the fin width is reduced, thereby reducing the junction area in reverse biasing mode and increasing parasitic capacitance and resistance.

Therefore, a need exists for methodology enabling fabrications of smaller fin-based diodes with low leakage current and ideality as well as low capacitance and carrier storage and increased current, and the resulting devices.

SUMMARY

An aspect of the present disclosure is a method for forming a fin-based RF diode with improved performance characteristics.

Another aspect of the present disclosure is a device including a fin-based RF diode with improved performance characteristics.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming fins over a substrate, separated from each other, each fin having a lower portion and an upper portion; forming shallow trench isolation (STI) regions over the substrate, between the lower portions of adjacent fins; implanting the lower portion of each fin with a first-type dopant; implanting the upper portion of each fin, above the STI region, with the first-type dopant; forming a junction region around a depletion region and along exposed sidewalls and a top surface of the upper portion of each fin; and forming a contact on exposed sidewalls and a top surface of each junction region.

In one aspect, the first-type dopant includes a p-type dopant.

Another aspect includes forming the junction region by plasma doping or with an energy of 0.1 to 0.5 KeV.

One aspect includes implanting the lower portion of each fin to a higher concentration level of the first-type dopant than the upper portion of each fin.

An additional aspect includes forming the upper portion of each fin with a top surface narrower than a bottom surface.

A further aspect includes forming an active depletion region between the depletion region and the lower portion of each fin.

Another aspect includes increasing a forward current capacity by increasing a concentration level of the diode cathode dopant.

One aspect includes increasing a forward current capacity by increasing an area of the junction region.

A further aspect includes forming the junction region by implanting the exposed sidewalls and the top surface of each fin with a diode cathode dopant.

An additional aspect includes forming a layer of silicide material on the exposed sidewalls and the top surface of each fin for forming the junction region.

Another aspect includes reducing a charge capacitance in the depletion region by reducing a size of the depletion region.

Another aspect of the present disclosure includes a device including: fins over a substrate, separated from each other, each fin having a lower portion and an upper portion; shallow trench isolation (STI) regions over the substrate, between the lower portions of adjacent fins; the lower portion of each fin implanted with a first-type dopant; the upper portion of each fin, above the STI region, implanted with the first-type dopant; a junction region around a depletion region and along exposed sidewalls and a top surface of the upper portion of each fin; and a contact on a top surface of each junction region.

In one aspect, the first-type dopant includes a p-type dopant.

In another aspect, the lower portion of each fin is implanted with the first-type dopant to a higher concentration level than the upper portion of each fin.

In a further aspect, the upper portion of each fin has a top surface narrower than a bottom surface.

Another aspect includes an active depletion region between the depletion region and the lower portion of each fin.

In an additional aspect, the junction region, including the exposed sidewalls and the top surface of each fin, is implanted with a diode cathode dopant.

In one aspect, the junction region includes a layer of silicide gate material on the exposed sidewalls and the top surface of each fin.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in a block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of reduced junction area and increased parasitic resistance and capacitance attendant upon scaling down fin-based RF diodes. The present disclosure addresses and solves such problems, for instance, by, inter alia, forming fins with optimized fin-widths for larger diode junction regions and lower diode series resistance resulting in higher current.

Methodology in accordance with embodiments of the present disclosure includes forming fins over a substrate, separated from each other, each fin having a lower portion and an upper portion. STI regions are formed over the substrate, between the lower portions of adjacent fins. The lower and upper portions of each fin are implanted with a first-type dopant. A junction region is formed around a depletion region and along exposed sidewalls and a top surface of the upper portion of each fin. Last, a contact is formed on exposed sidewalls and a top surface of each junction region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
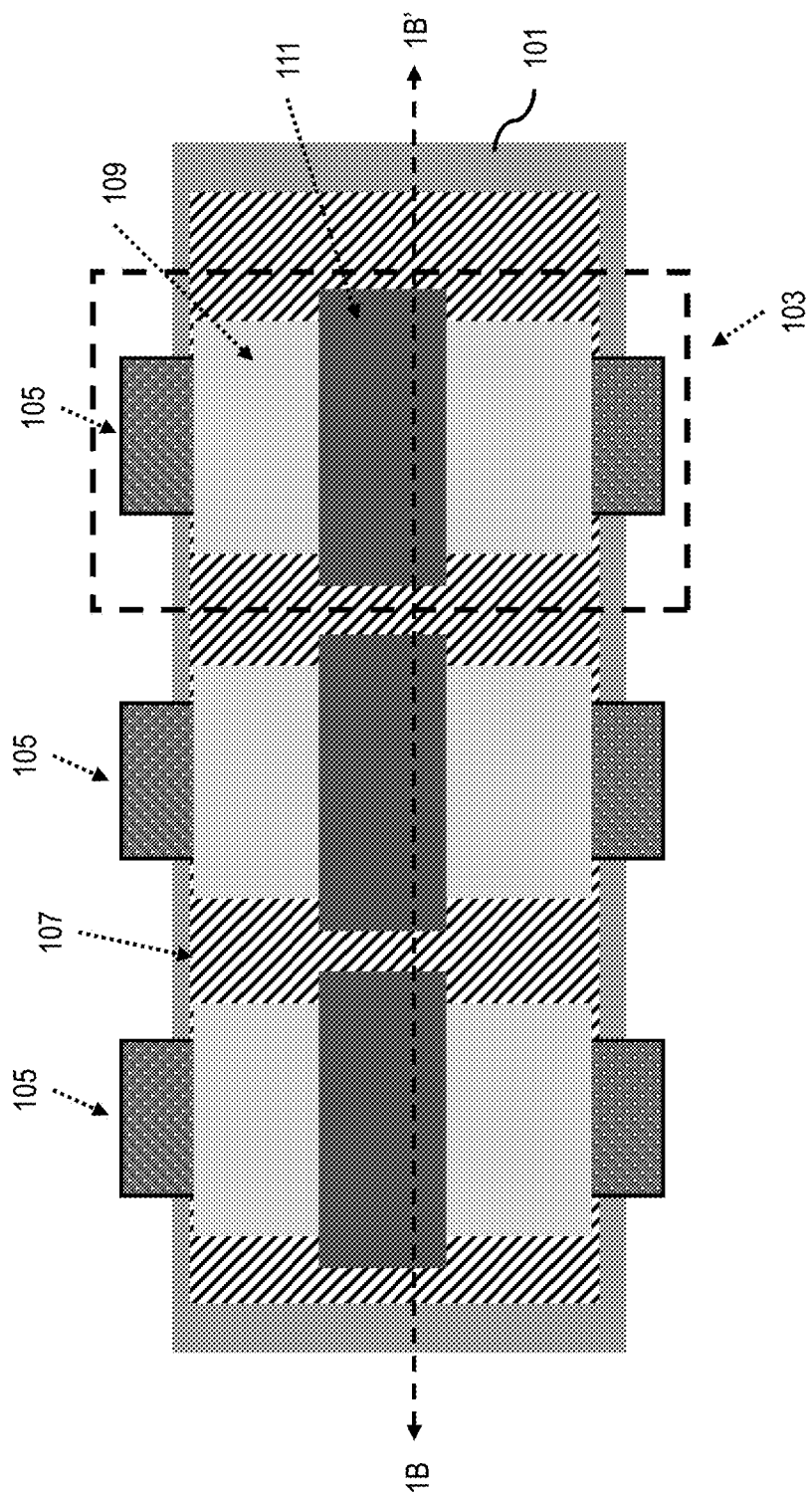
FIG. 1A illustrates a top view of a layout of Fin-based RF diodes, in accordance with an exemplary embodiment.

FIG. 1A illustrates a substrate 101 (e.g. p-type) and Fin-based RF diodes including fins 105 separated from each other by STI regions 107 over the substrate 101. Junction regions 109 may be formed on exposed sidewalls and the top surface of each fin 105. A contact layer 111 may be formed on sidewalls and the top surface of each junction region 109. The line 1B-1B' illustrates the cut-line for the cross-sectional views of the method of forming the Fin-based RF diodes of FIG. 1A, beginning with FIG. 1B.

Figure 1B:
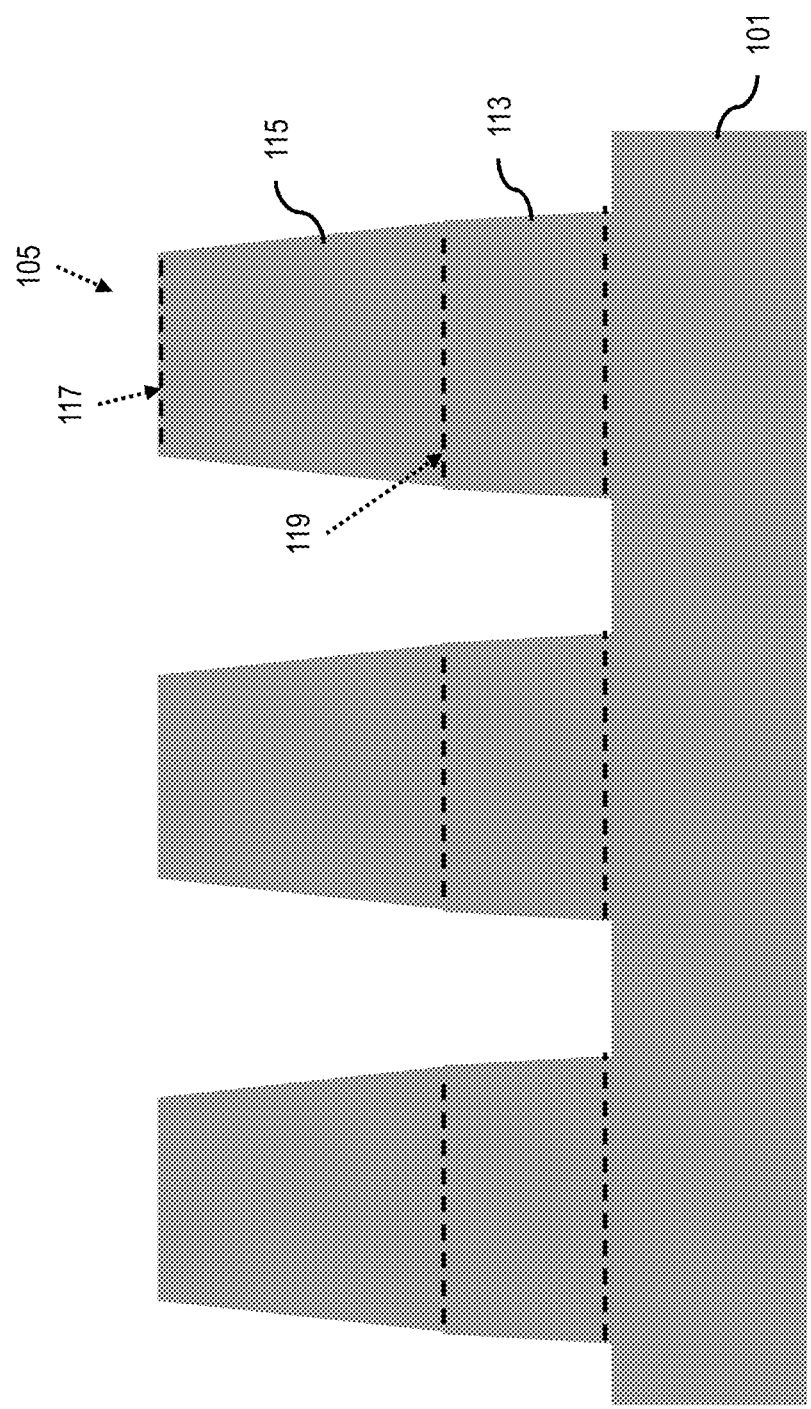
FIGS. 1B through 1G illustrate cross-sectional views of a process flow for forming Fin-based RF diodes, in accordance with an exemplary embodiment.

FIG. 1B illustrates the substrate 101 and fins 105 separated from each other over the substrate 101. The fins 105 include a lower portion 113 and an upper portion 115. The upper portion 115 of each fin 105 may be formed with a top surface 117 narrower than a bottom surface 119, for example, by using spacer merging and etching processes.

Figure 1C:
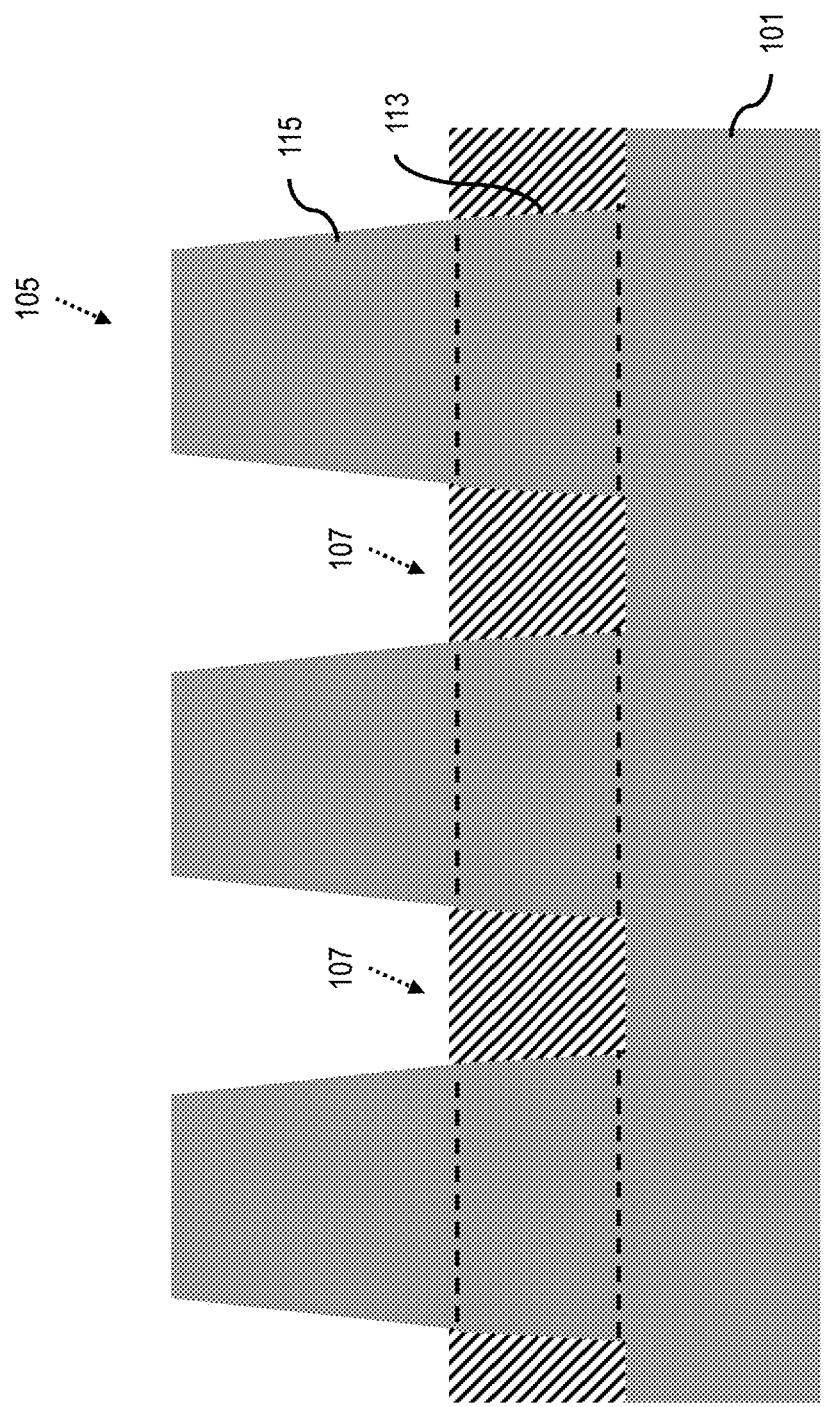

In FIG. 1C, STI regions 107 are formed over the substrate 101 and between the lower portions 113 of adjacent fins 105.

Figure 1D:
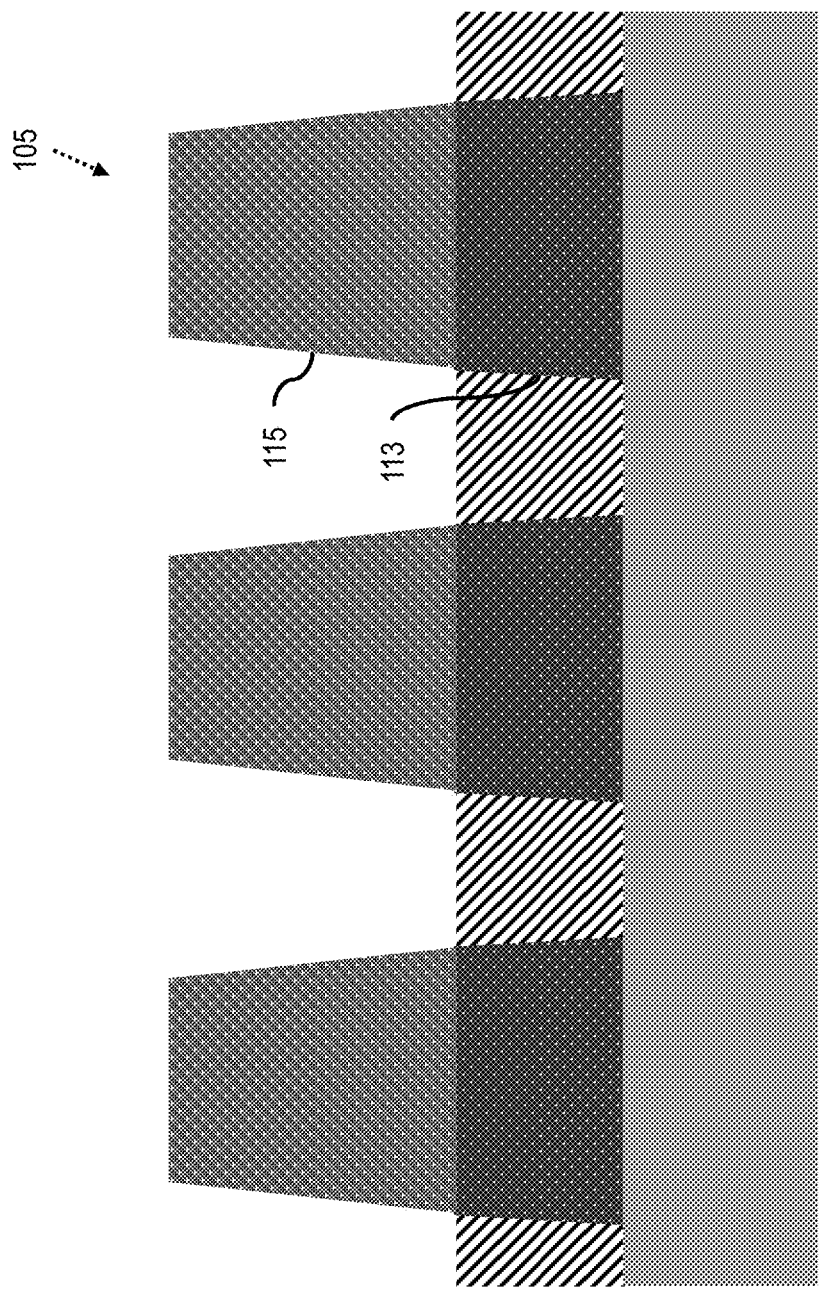

As illustrated in FIG. 1D, the lower and upper portions, 113 and 115, of each fin 105 are implanted with a first-type dopant (e.g. a p-type dopant) such as boron, wherein the lower portions 113 may be implanted to a higher concentration level than the concentration level at the upper portions 115 of each fin 105. The doped lower portion may have a concentration of 1e14 to 1e16, whereas the upper portion may have a concentration of 1e12 to 1e14.

Figure 1E:
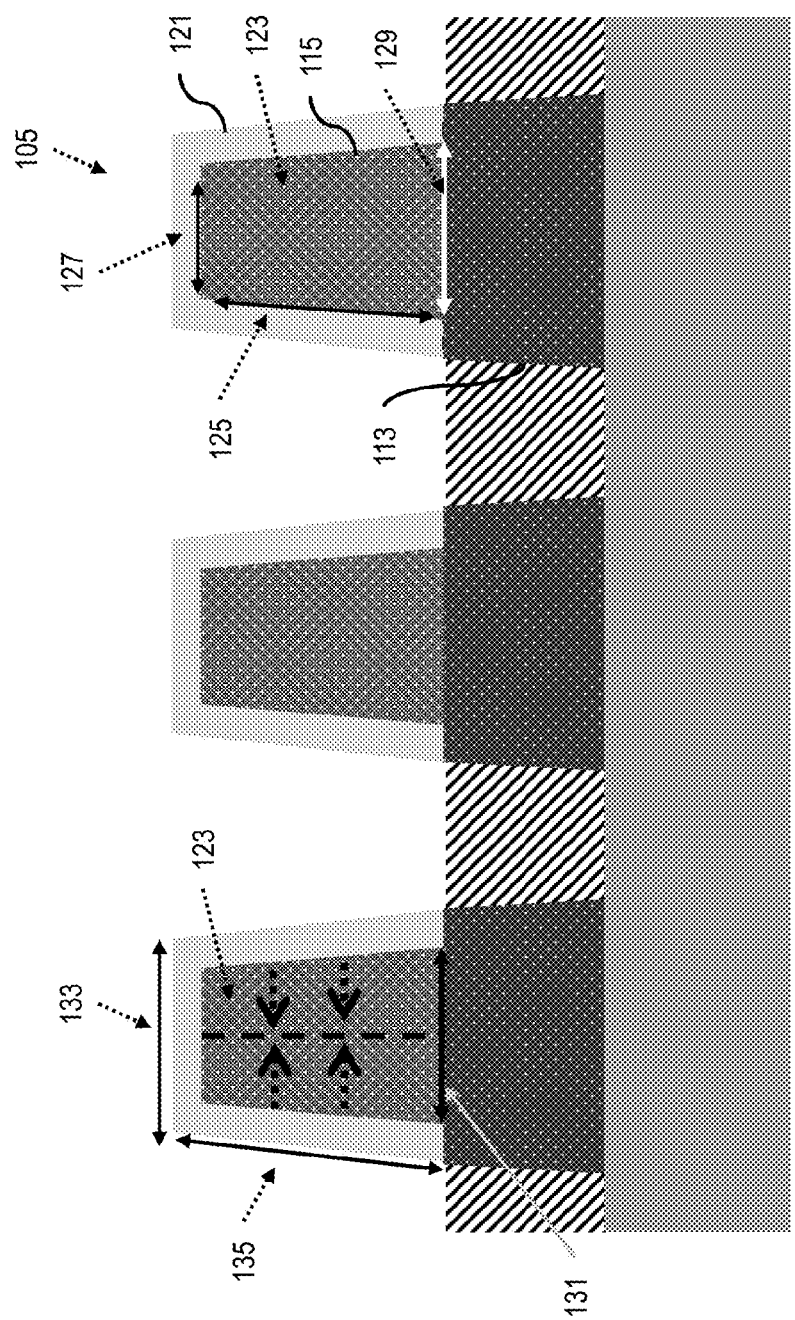

In FIG. 1E, a junction region 121 may be formed around a depletion region 123 and along exposed sidewalls 125 and a top surface 127 of the upper portion 115 of each fin 105. The light doping in region 123 allows depleting to spread more readily. The junction may be formed by plasma doping or low energy doping, e.g. at an energy of 0.1 to 0.5 KeV, with a second-type dopant (e.g. an n-type dopant, such as phosphorous). An active depletion region 129 of current flow is formed between the depletion region 123 and the lower portion 113 of each fin 105. A capacitance in the depletion region 123 may be reduced by reducing a size of the depletion region 123. An effective depletion region, which can affect the capacitance, may depend on a base of active depletion region 129. A complementary doping (with the first-type dopant being an n-type and the second-type dopant being a p-type) can be alternatively used for P+/n type diode formation.

Merging of depletion region 123 from both sides of the junction can result in a fixed narrow depletion region 123 even without doping of the junction region 121. The effective area of the junction is twice the height (h) 135 plus the width of the top (ft) 133. Forward current increases with junction area. Higher N+ doping in the junction area also increases current. A higher drive current may be achieved by a having a SiGe depletion region 123. Depending on the N+ doping and a fin-width, the depletion region 123 may be depleted and non-depleted. In addition, the off-state capacitance, when the depletion region is merged is the width of the bottom (fb) 131.

For a planar diode, the junction width is about 48 nm and for a conventional fin based diode, it is about 13 nm. Thus, if, for example, the effective junction width, or the sum of two times the height (e.g. 40 nm) and the top width (ft) (e.g.

6 nm), equals 86, the gain over a planar diode is about two times and over a conventional fin-type diode is about seven times at the current technology node, which increases as the technologies are scaled down. Also, since the depletion width (d) can increase from, for example, 5 nm to 42 nm, and capacitance is proportional to 1/d, the device of FIG. 1A has a reduction in capacitance of about 8 times, assuming the junctions are close to the surface.

With a reverse bias, the depletion region 123 in general grows even further in lightly doped region, but its growth is limited by another region growing from sidewalls 125. After merge, the depletion region 123 may remain the same (e.g. not grow) irrespective of a forward or reverse bias application. The depletion region 123 may have a fixed capacitance for any given bias after a fixed bias voltage. A smaller depletion region 123 may lead to a smaller capacitance as it depends upon the top 133 to bottom 131 of the depletion region 123. In switching application, charge can be easily swept from on to off states. Active area of the cap (e.g. 2×125+127) depends upon the base 129 active region 131 of the cap resulting in lower capacitance for a smaller area.

A narrower fin-width may result in an increase in parasitic resistance, which may influence performance characteristics of an RF diode. An optimum fin-width may be determined based on desired performance characteristics of an RF diode. Additionally, performance of the RF diode may be further optimized by determining optimum doping parameters. A base region under the cap may have a higher doping level for a lower parasitic resistance.

Figure 1F:
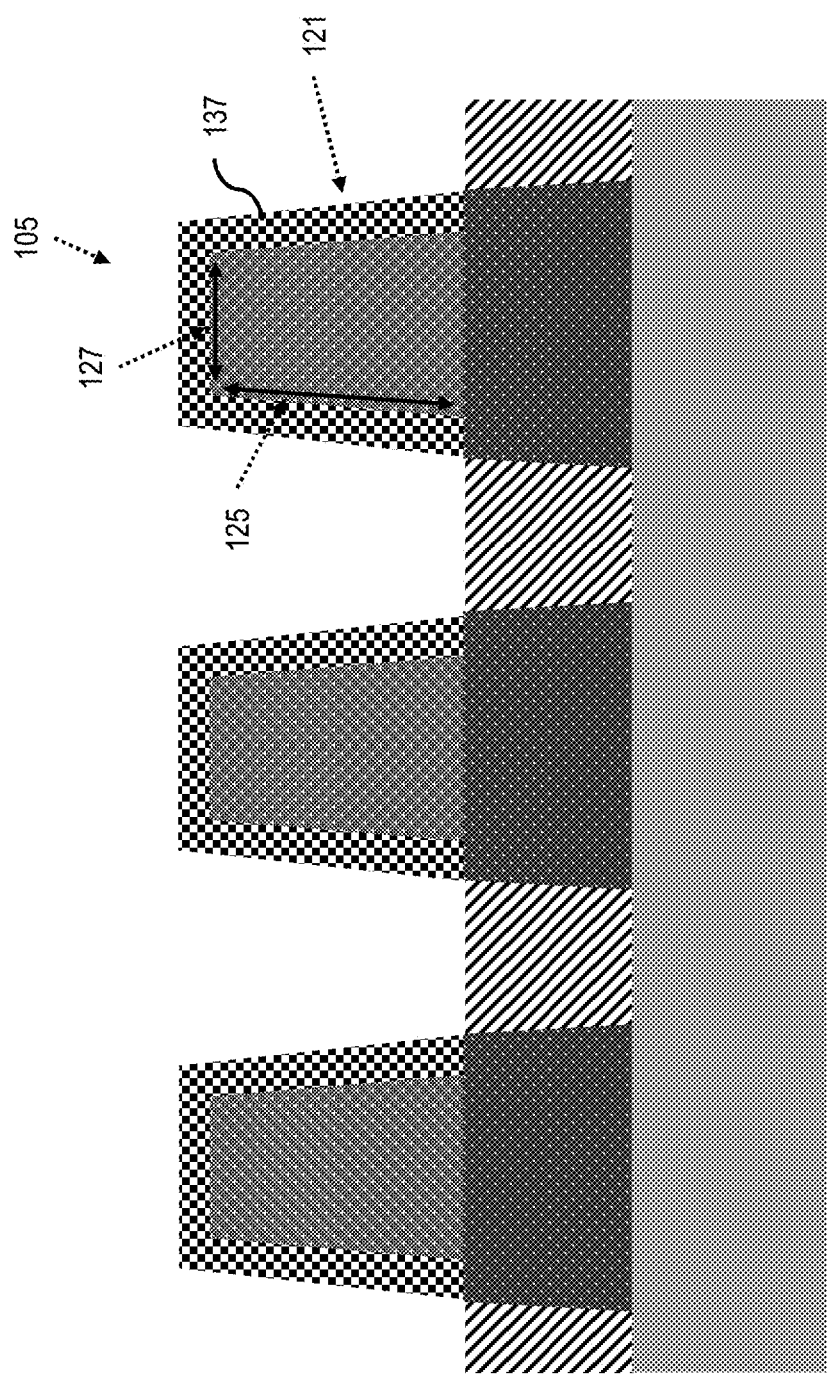

As illustrated in FIG. 1F, alternatively, the junction region 121 may be formed by forming a layer of silicide material 137 on the exposed sidewalls 125 and the top surface 127 of each fin 105. Titanium silicide (TiSi), nickel silicide (NiSi), tungsten silicide (WSi), etc. provide Schottky diode like features and significantly increase the diode speed as well as multiply the forward current.

Figure 1G:
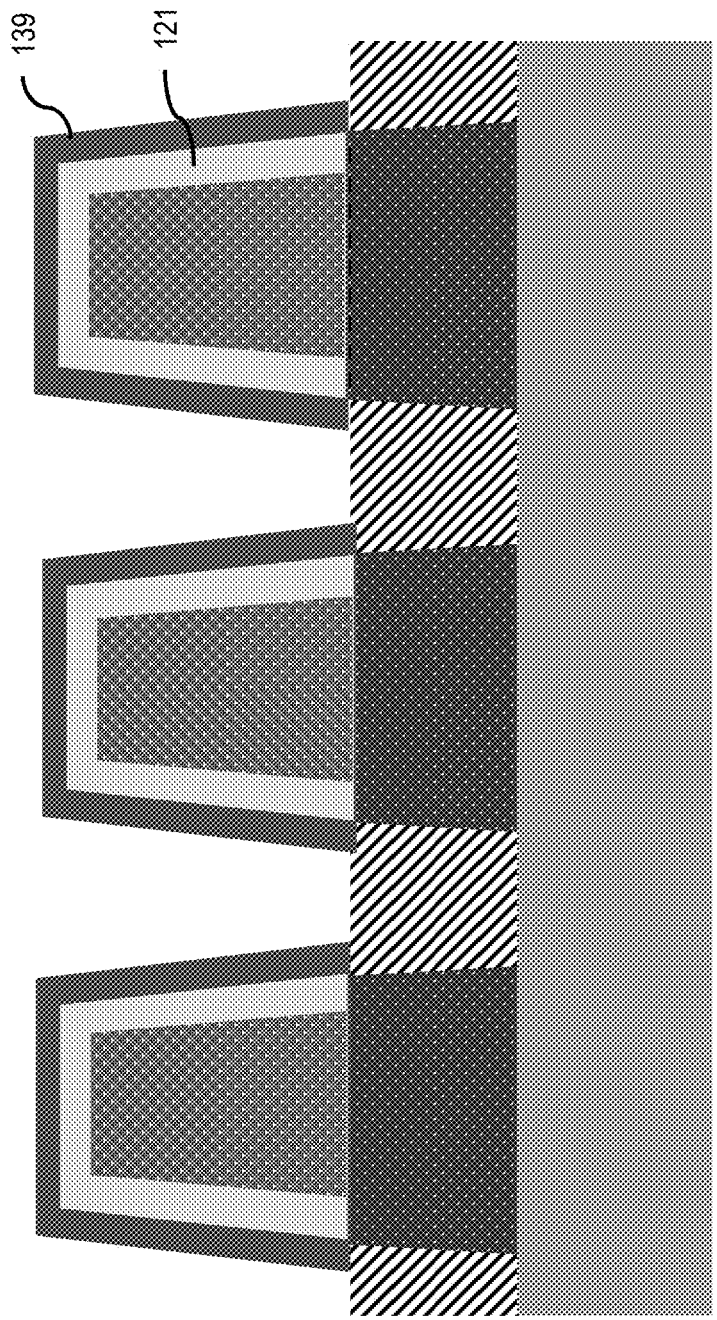

As illustrated in FIG. 1G, in either of the cases described in FIGS. 1E and 1F, a contact layer 139 (e.g. titanium-silicide) may be formed on exposed sidewalls and top surface of each junction region 121.

The embodiments of the present disclosure can achieve several technical effects including increasing the width of the diode depletion region (e.g. wider than a conventional diode) for lowering the capacitance. Also, the transition region from the on-state to the off-state shows fast switching from a high to a low capacitance (the capacitance acts as an RC delay). Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   fins over a substrate, separated from each other, each fin having a lower portion and an upper portion;
   shallow trench isolation (STI) regions over the substrate, between the lower portions of adjacent fins;
   the lower portion of each fin implanted with a first-type dopant;
   the upper portion of each fin, above the STI region, implanted with the first-type dopant;
   a junction region around a depletion region and along exposed sidewalls and a top surface of the upper portion of each fin; and
   a contact layer on a top surface of each junction region,
   wherein the lower portion of each fin is implanted with the first-type dopant to a higher concentration level than the upper portion of each fin.

2. The device according to claim 1, wherein the first-type dopant comprises a p-type dopant.

3. The device according to claim 2, wherein the first-type dopant comprises boron.

4. The device according to claim 1, wherein the lower portion has a concentration of 1e14 to 1e16 cm$^{-3}$ and the upper portion has a concentration of 1e12 to 1e14 cm$^{-3}$.

5. The device according to claim 1, wherein the upper portion of each fin has a top surface narrower than a bottom surface.

6. The device according to claim 1, further comprising:
   an active depletion region between the depletion region and the lower portion of each fin.

7. The device according to claim 1, wherein the junction region, including the exposed sidewalls and the top surface of each fin, is implanted with a diode cathode dopant.

8. The device according to claim 7, wherein the diode cathode dopant comprises an n-type dopant.

9. The device according to claim 8, wherein the n-type dopant comprises phosphorus.

10. The device according to claim 1, wherein the junction region comprises a layer of silicide gate material on the exposed sidewalls and the top surface of each fin.

11. The device according to claim 1, wherein the contact layer on the top surface of each junction region comprises titanium silicide (TiSi).

12. A device comprising:
   fins over a substrate, separated from each other, each fin having a lower portion and an upper portion;
   shallow trench isolation (STI) regions over the substrate, between the lower portions of adjacent fins;
   the lower portion of each fin implanted with a first-type dopant;
   the upper portion of each fin, above the STI region, implanted with the first-type dopant;
   a depletion region in the upper portion of each fin;
   a junction region around the depletion region and along exposed sidewalls and a top surface of the upper portion of each fin;
   an active depletion region between the depletion region and the lower portion of each fin; and
   a titanium silicide (TiSi) layer on exposed sidewalls and top surface of the junction region,
   wherein the lower portion of each fin is implanted with the first-type dopant to a higher concentration level than the upper portion of each fin.

13. The device according to claim 12, wherein the lower portion has a concentration of 1e14 to 1e16 cm$^{-3}$ and the upper portion has a concentration of 1e12 to 1e14 cm$^{-3}$.

14. The device according to claim 12, wherein the upper portion of each fin has a top surface narrower than a bottom surface.

15. The device according to claim 12, wherein the junction region over the exposed sidewalls and top surface of the upper portion of the plurality of fins is an effective area.

16. The device of claim 12, wherein the junction region has a width of 48 nanometer (nm) for a planar diode and 13 nm for a conventional fin based diode.

17. A device comprising:
fins over a substrate, separated from each other, each fin having a lower portion and an upper portion, and wherein the upper portion of each fin has a top surface narrower than a bottom surface;
shallow trench isolation (STI) regions over the substrate, between the lower portions of adjacent fins;
the lower portion of each fin implanted with boron (B) at a concentration of 1e14 to 1e16 cm$^{-3}$;
the upper portion of each fin, above the STI region, implanted with B at a concentration of 1e12 to 1e14 cm$^{-3}$;
a junction region around a depletion region and along exposed sidewalls and a top surface of the upper portion of each fin; and
a titanium silicide (TiSi) layer on exposed sidewalls and top surface of the junction region.

18. The device according to claim 17, wherein the junction region comprises a layer of silicide gate material implanted with a diode cathode dopant.

* * * * *